United States Patent
Tsuchiya et al.

(10) Patent No.: US 10,568,249 B2
(45) Date of Patent: Feb. 18, 2020

(54) SUCTION NOZZLE, MOUNTING DEVICE, AND COMPONENT RELEASE METHOD

(71) Applicant: FUJI CORPORATION, Chiryu-shi (JP)

(72) Inventors: Yusuke Tsuchiya, Toyota (JP); Tatsuya Takasu, Okazaki (JP); Akira Furuichi, Kariya (JP)

(73) Assignee: FUJI CORPORATION, Chiryu-shi (JP)

( * ) Notice: Subject to any disclaimer, the term of this patent is extended or adjusted under 35 U.S.C. 154(b) by 135 days.

(21) Appl. No.: 15/548,449

(22) PCT Filed: Feb. 5, 2015

(86) PCT No.: PCT/JP2015/053243
§ 371 (c)(1),
(2) Date: Aug. 3, 2017

(87) PCT Pub. No.: WO2016/125285
PCT Pub. Date: Aug. 11, 2016

(65) Prior Publication Data
US 2018/0352690 A1    Dec. 6, 2018

(51) Int. Cl.
*H05K 13/04* (2006.01)
*B25J 15/06* (2006.01)
*B23B 31/30* (2006.01)

(52) U.S. Cl.
CPC ...... *H05K 13/0408* (2013.01); *B25J 15/0616* (2013.01); *H05K 13/046* (2013.01);
(Continued)

(58) Field of Classification Search
CPC ................ B23B 31/107; B23B 31/307; H05K 13/0409; H05K 13/0408; H05K 13/046;
(Continued)

(56) References Cited

U.S. PATENT DOCUMENTS 5,348,316 A * 9/1994 Lin ..................... H01L 21/6838
279/3
5,533,253 A * 7/1996 Mifuji ................ H05K 13/0417
29/741

(Continued)

FOREIGN PATENT DOCUMENTS

EP      1871158 A2 * 12/2007   ......... H05K 13/0409
JP      4-122425 U    11/1992
(Continued)

OTHER PUBLICATIONS

Machine Translation, Japan Patent Document, JP 7011864 Y2, Komori et al. (Year: 1995).*
(Continued)

*Primary Examiner* — Eric A. Gates
*Assistant Examiner* — Chwen-Wei Su
(74) *Attorney, Agent, or Firm* — Oblon, McClelland, Maier & Neustadt, L.L.P.

(57) ABSTRACT

In a suction nozzle, a tip portion of an air pipe includes an opening portion having an area larger than that of a flow path of the air pipe, and a slit which is formed on the tip portion of the air pipe is provided in a portion of a circumferential contact surface contacting the component. In the suction nozzle, since air supplied from the air pipe flows out through the slit, the suction state of the component is canceled from the position of the slit as a base point.

11 Claims, 7 Drawing Sheets

(52) U.S. Cl.
CPC ........ *H05K 13/0409* (2018.08); *B23B 31/307* (2013.01); *Y10T 279/11* (2015.01)

(58) Field of Classification Search
CPC .. H01L 21/6838; B25J 15/0616; Y10T 279/11
See application file for complete search history.

(56) References Cited

U.S. PATENT DOCUMENTS

| | | | | |
|---|---|---|---|---|
| 5,961,168 | A * | 10/1999 | Kanno | B65G 47/91 294/185 |
| 7,214,568 | B2 * | 5/2007 | Brennan | H01L 21/30608 257/E21.223 |
| 7,793,408 | B2 * | 9/2010 | Oh | H01L 21/6838 29/743 |
| 7,823,941 | B2 * | 11/2010 | Caldwell | B65G 47/911 294/64.3 |
| 8,616,539 | B2 * | 12/2013 | Tseng | H01L 21/6838 269/21 |

FOREIGN PATENT DOCUMENTS

| | | | |
|---|---|---|---|
| JP | 7011864 Y2 * | 3/1995 | |
| JP | 8-191153 A | 7/1996 | |
| JP | 2003-262661 A | 9/2003 | |
| JP | 2006-108198 A | 4/2006 | |
| JP | 2007-266331 A | 10/2007 | |
| WO | WO 2013/124964 A1 | 8/2013 | |
| WO | WO-2014033794 A1 * | 3/2014 | .......... B25J 15/0616 |

OTHER PUBLICATIONS

International Search Report dated Mar. 10, 2015 in PCT/JP2015/053243 filed Feb. 5, 2015.

Extended European Search Report dated Feb. 16, 2018 in European Patent Application No. 15881102.6 citing document AO therein 11 pages.

* cited by examiner

SUCTION NOZZLE, MOUNTING DEVICE, AND COMPONENT RELEASE METHOD

TECHNICAL FIELD

The present disclosure relates to a suction nozzle, a mounting device, and a component release method.

BACKGROUND ART

In the related art, as a suction nozzle, a suction nozzle is proposed that includes a suction tubular portion at the lower end portion and a main body tubular portion connected to the suction tubular portion, in which a suction passage is formed on a center portion of the suction tubular portion and is formed a pair of slits extended to a lower end portion on a side face thereof (see, for example, PTL 1). This suction nozzle can prevent as much as possible a component-remained-on-nozzle phenomenon that a component is not separated from the suction nozzle when being mounted on a printed circuit board.

CITATION LIST

Patent Literature

PTL 1: JP-A-2007-266331

SUMMARY

However, in the suction nozzle described above, although the generation of the component-remained-on-nozzle phenomenon is suppressed by the pair of slits, the component-remained-on-nozzle phenomenon may be generated according to a component type, and thus further improvement is required.

The present disclosure has been made in view of the above problems and a main object thereof is to provide a suction nozzle which can more reliably perform suction canceling of a component, a mounting device, and a component release method.

The present disclosure adopts following means in order to achieve the main object described above.

A suction nozzle according to the present disclosure is a suction nozzle used in a mounting device for mounting a component on a board including: an air pipe; a tip portion for contacting a component, the tip portion being formed at a tip of the air pipe, and including an opening portion having an area larger than that of an air flow path formed in the air pipe; and a slit that is provided on a portion of a circumferential contact surface of the tip portion.

In the suction nozzle, the tip portion of the air pipe includes the opening portion which has an area larger than that of the flow path on the side of the air pipe and the slit which is formed on the tip portion of the air pipe is provided on a portion of the circumferential contact surface contacting the component. In the suction nozzle, since the air supplied from the air pipe flows out through the slit, the suction state of the component can be canceled from the position of the slit as the base point and the component can be more reliably separated off. In addition, the tip portion has the opening portion larger than the flow path and the slit is formed on the further outer circumferential side. Therefore, since the air flows out from the further outer circumferential side through the slit, stress is likely to be applied to the component and the suction canceling of the component is likely to be performed. Therefore, in the suction nozzle, the suction canceling of the component can be more reliably performed.

In the suction nozzle of the present disclosure, the tip portion may be formed in a shape that a dome portion of the component having a dome shape can enter. In the suction nozzle, when the component having the dome shape component is mounted, the suction canceling of the component can be more reliably performed.

In the suction nozzle of the present disclosure, the slit may have a ratio of an opening area Y of the slit to a sectional area X of the flow path of 40% or more. In a case where a positive pressure is applied when performing suction canceling of a component, since the suction nozzle can further suppress generation of airflow of exhaust and intake (also referred to as ejector effect) generated in a gap between the component and the tip portion, the canceling of the suction state of the component can be more reliably performed. The suction nozzle is particularly effective for suction and suction canceling of the component having the dome shape. In this case, it is preferable that the slit has a ratio of an opening area Y of the slit to a sectional area X of the flow path of 60% or more. The suction nozzle can more reliably perform the canceling of the suction state of the component.

In the suction nozzle of the present disclosure, the contact surface formed in the tip portion is capable of contacting an abutting surface of the component of which the abutting surface is planar. In the suction nozzle, suction of the component having the planar abutting surface can be more reliably performed. In this case, the slit may have a ratio of an opening area Y of the slit to a sectional area X of the flow path of 20% or more. In the suction nozzle, the ejector effect can be further suppressed when performing the suction canceling of the component and the canceling of the suction state of the component can be more reliably performed. When efficiency at the time of the suction is considered, the ratio of the area Y of the slit on the contact surface to the sectional area X of the flow path is preferably 120% or less, more preferably 100% or less, and further preferably 80% or less.

In the suction nozzle of the present disclosure, a taper portion having a taper surface connecting the slit and the flow path to each other in an inside portion thereof may be formed in the tip portion. An opening portion having an area larger than that of the flow path can be more easily formed in the suction nozzle by the taper portion having the taper surface. In this case, it is preferable that the taper portion is formed with a clearance such that the dome portion and the taper surface are not in contact with each other when the dome portion enters. In the suction nozzle, the ejector effect can be further suppressed when performing the suction canceling of the component and the canceling of the suction state of the component can be more reliably performed.

In the suction nozzle of the present disclosure, one of the slit may be formed on the contact surface. Generally, in the suction nozzle, in a case where multiple slits are formed at an end portion of the suction nozzle, when a positive pressure is applied at the time of the suction canceling of the component, a phenomenon (known as an ejector effect) in which exhaust airflow is generated at one slit and intake airflow is generated at the other slit is likely to occur. By providing only one slit in the suction nozzle, generation of the ejector effect can be further suppressed, and canceling of the suction state of the component can be more reliably performed.

In the suction nozzle of the present disclosure, the abutting surface of the tip portion to be contacted may be configured to suck a component formed of a resin having flexibility and/or adhesiveness. In a component in which the abutting surface of the component is formed of a resin having flexibility and/or adhesiveness, an ejector effect is likely to be generated in a gap between the component and the tip portion. Therefore, the suction nozzle of the present disclosure is particularly effective in the suction canceling of a component of which the abutting surface is formed of a resin having flexibility and/or adhesiveness.

A mounting device according to the present disclosure includes a mounting head on which the suction nozzle described in any one of the above is mounted and a control section which performs a discard process of the component by supplying air to the suction nozzle which sucks the component.

Since the mounting device includes any one of the suction nozzles described above, as with the suction nozzles described above, the suction canceling of the component can be more reliably performed. In the mounting device, if any one of the suction nozzles described above is adopted, an effect corresponding to the suction nozzle can be obtained.

In the mounting device of the present disclosure, the control section may apply an exhaust pressure of 10 kPa or more to the suction nozzle which sucks the component when performing the discard process. In the mounting device, since any one of the suction nozzles described above is provided, the suction canceling of the component can be more reliably performed even at an exhaust pressure of 10 kPa or more. This exhaust pressure may be 30 kPa or more and may be 50 kPa or more, for example. In addition, the exhaust pressure thereof may be 250 kPa or less.

In a component release method according to the present disclosure, air is supplied to the suction nozzle described in any one described above, which sucks the component, and the component is separated off from the suction nozzle from the position of the slit as a base point by air flowing out from the slit.

In the component release method, since any one of the suction nozzles described above is used, as with the suction nozzles described above, the suction canceling of the component can be more reliably performed. In the component release method, if any one of the suction nozzles described above is adopted, an effect corresponding to the suction nozzle can be obtained.

DESCRIPTION OF EMBODIMENTS

Figure 1:
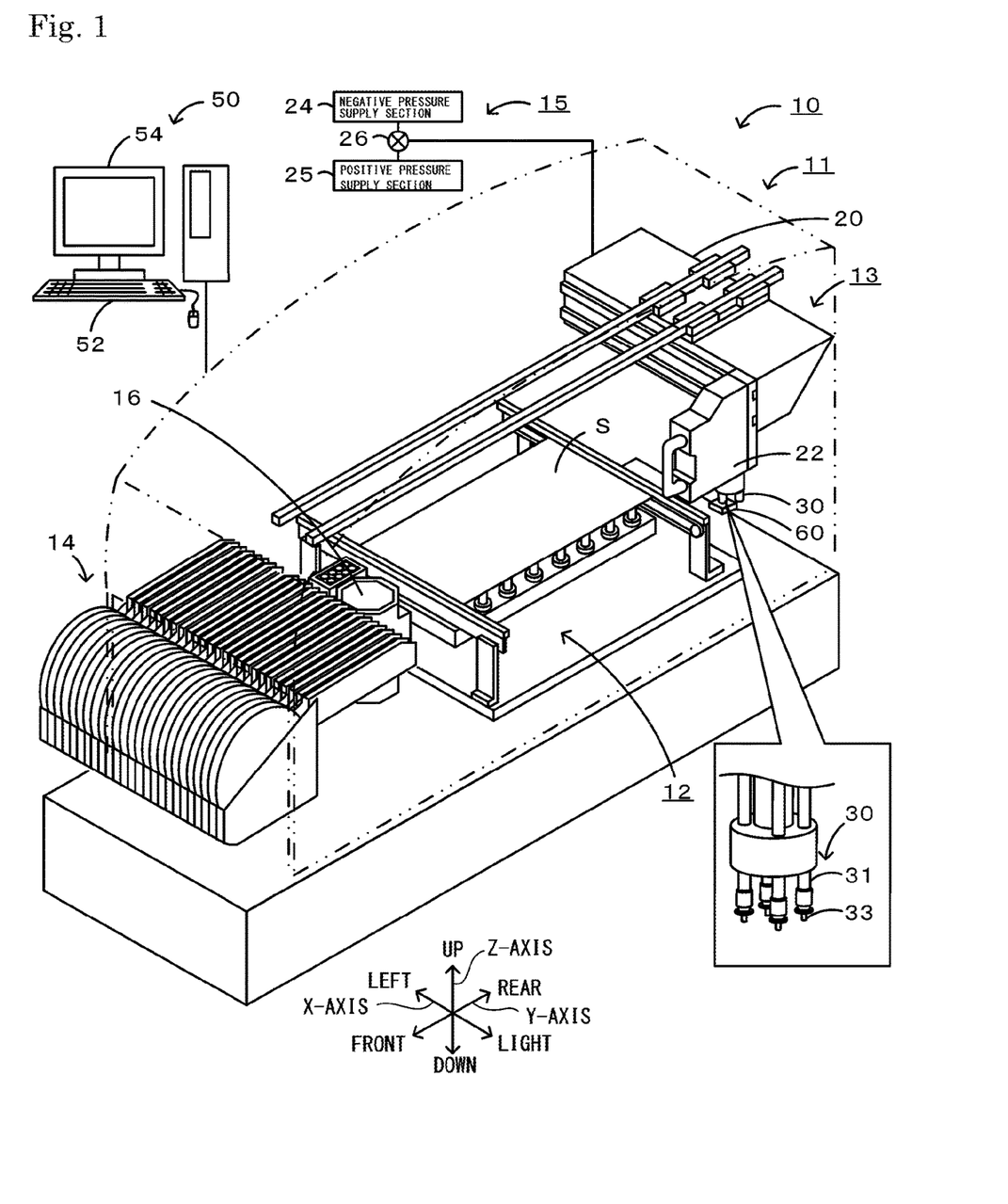
FIG. 1 is a schematic explanatory diagram illustrating an example of a mounting system 10.
Figure 2:
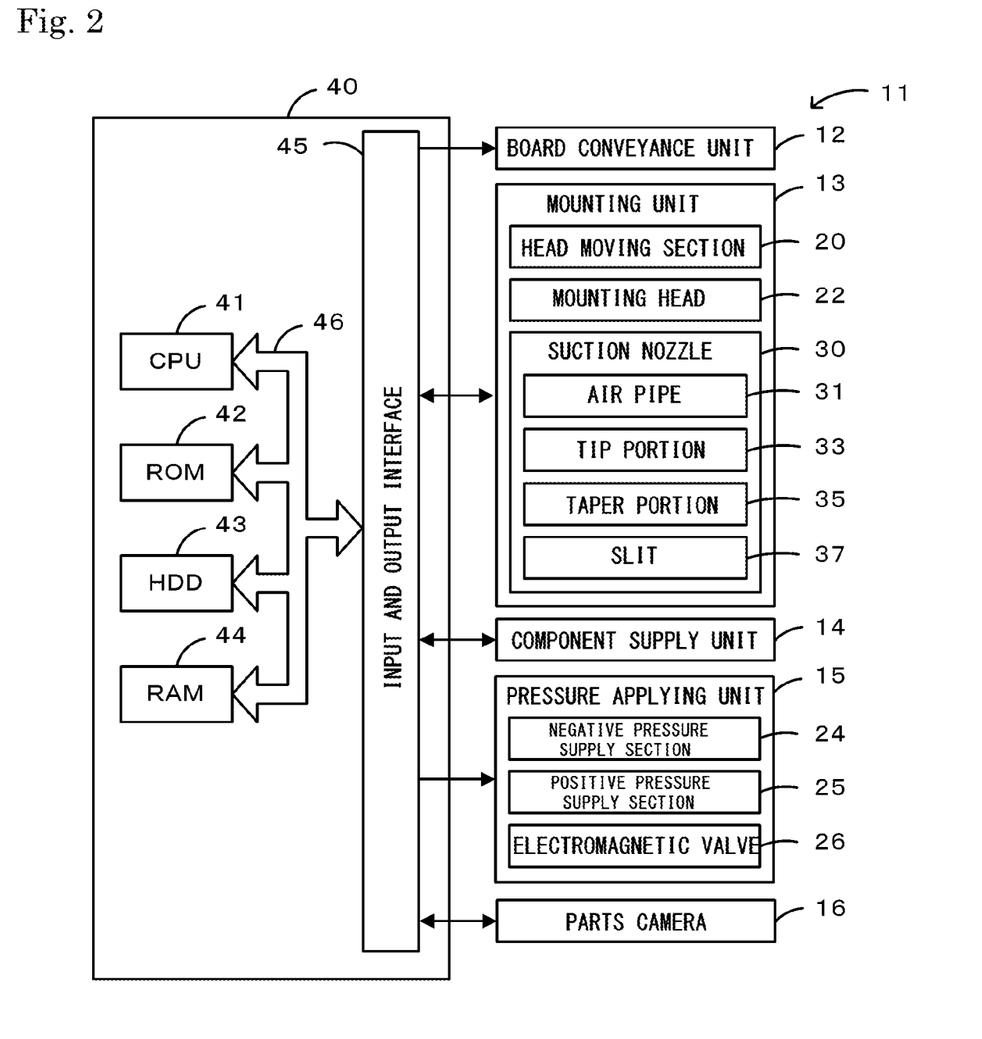
FIG. 2 is a block diagram illustrating a configuration of a mounting device 11.

Preferred embodiments of the present disclosure will be described below with reference to the drawings. FIG. 1 is a schematic explanatory view illustrating an example of a mounting system 10. FIG. 2 is a block diagram illustrating a configuration of a mounting device 11. The mounting system 10 is a system which performs a mounting process related to a process of mounting a component on a board S. The mounting system 10 includes the mounting device 11 and a management computer 50. In the mounting system 10, multiple mounting devices 11 for performing the mounting process of mounting the component on the board S are disposed from an upstream to a downstream thereof. In FIG. 1, only one mounting device 11 is illustrated for convenience of explanation. The mounting process includes processes of disposing, mounting, inserting, joining, and bonding the component on the board. In addition, in the present embodiment, the left-right direction (X-axis), the front-back direction (Y-axis), and the up-down direction (Z-axis) are as illustrated in FIG. 1. In addition, in the present embodiment, it is mainly described using the suction nozzle 30 and the component 60 and constituents thereof are collectively referred by omitting signs. For example, the components 60 and 60B are collectively referred to as "component," and the suction nozzles 30 and 30B are collectively referred to as "suction nozzle."

As illustrated in FIG. 1 and FIG. 2, the mounting device 11 includes a board conveyance unit 12, a mounting unit 13, a component supply unit 14, a pressure applying unit 15, a parts camera 16, and a control device 40. The board conveyance unit 12 is a unit which performs loading, conveyance, fixing at a mounting position, and unloading of a board S. The board conveyance unit 12 has a pair of conveyor belts provided with intervals in front and rear in FIG. 1 and bridged across in the left-right direction. The board S is conveyed by this conveyor belt.

The mounting unit 13 collects a component from the component supply unit 14 and places the component on the board S fixed to the board conveyance unit 12. The mounting unit 13 includes a head moving section 20, a mounting head 22, and a suction nozzle 30. The head moving section 20 includes a slider which is guided by a guide rail and moves in the XY-directions and a motor which drives the slider. The mounting head 22 is detachably mounted on the slider and moves in the XY-directions by the head moving section 20. One or more suction nozzles 30 are detachably mounted on a lower face of the mounting head 22. The mounting head 22 incorporates a Z-axis motor, and the height of the suction nozzle 30 is adjusted along the Z-axis by the Z-axis motor. In addition, the mounting head 22 includes a rotating device which rotates (revolves) the suction nozzle 30 by a driving motor (not illustrated) and can adjust an angle of the component sucked by the suction nozzle 30.

The component supply unit 14 includes multiple reels and is detachably attached to a front side of the mounting device 11. A tape is wound around each reel and on the surface of the tape, multiple components 60 are held along the longitudinal direction of the tape. This tape is unwound from the reel toward the rear side and is sent out by a feeder section to a collection position where a component is sucked by the suction nozzle 30 in a state where a component is exposed.

The pressure applying unit 15 is a unit for applying a negative pressure or a positive pressure to the mounting head 22. The pressure applying unit 15 includes a negative pressure supply section 24, a positive pressure supply section 25, and an electromagnetic valve 26. The negative pressure supply section 24 includes a vacuum pump or the like and supplies a negative pressure to the mounting head 22. The positive pressure supply section 25 includes a normal pressure pipe, a pressure pump, or the like and supplies a positive pressure to the mounting head 22. The electromagnetic valve 26 switches a path for supplying a negative pressure and a positive pressure to the mounting head 22. The mounting head 22 sucks the component 60 to the suction nozzle 30 by the negative pressure supplied from the negative pressure supply section 24 through the electromagnetic valve 26. In addition, the mounting head 22 cancels the suction of the component 60 by the suction nozzle 30 by the positive pressure supplied from the positive pressure supply section 25 through the electromagnetic valve 26. The pressure applying unit 15 may be configured to apply an exhaust pressure of 10 kPa or more to the suction nozzle 30. If the exhaust pressure is 10 kPa or more, the suction canceling of the component 60 can be more reliably performed. The pressure applying unit 15 is designed according to the type of component to be used or the like and, for example, the exhaust pressure thereof may be 30 kPa or more, or 50 kPa or more. In addition, the exhaust pressure thereof may be 250 kPa or less.

Figure 3:
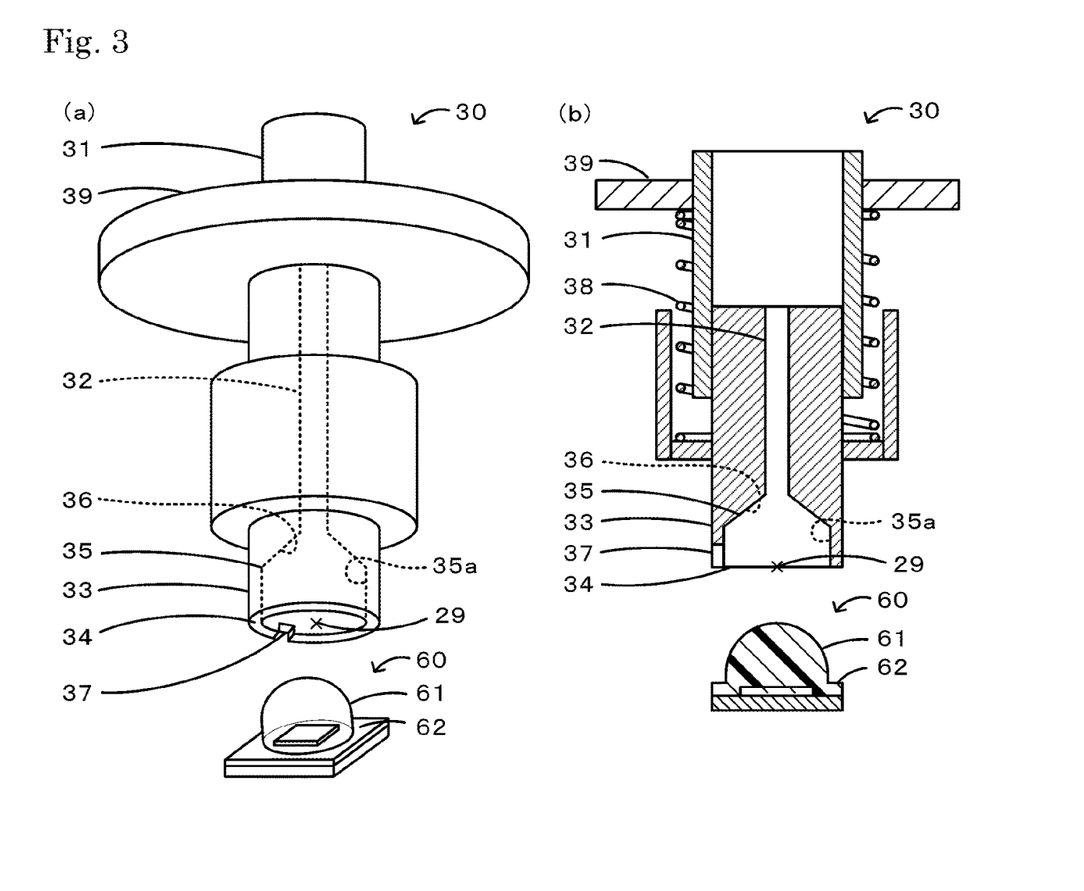
FIG. 3 is an explanatory view of a suction nozzle 30 for sucking a component 60 having a dome portion 61.

The suction nozzle 30 collects the component 60 by using pressure and is detachably attached to the mounting head 22. FIG. 3 is an explanatory view of the suction nozzle 30 for sucking the component 60 having the dome portion 61, FIG. 3(a) is a perspective view thereof and FIG. 3(b) is a sectional view thereof. As illustrated in FIG. 3, the suction nozzle 30 is configured to suck and hold the component 60 having a dome shape. The component 60 includes an abutting surface 62 which is an upper surface formed to be substantially parallel to a bottom face thereof and a dome portion 61 having a dome shape formed from the abutting surface 62 to an upper face. In the component 60, the dome portion 61 and the abutting surface 62 are formed of a resin having flexibility and/or adhesiveness. In other words, the component 60 may be formed of a resin having flexibility, adhesiveness, or flexibility and adhesiveness. Although the details will be described later, a case where canceling of suction of the component 60 by the suction nozzle 30 is unlikely to be performed is also generated. The component 60 may be, for example, an LED component in which the dome portion 61 is formed of a transparent resin having light transparency.

The suction nozzle 30 includes an air pipe 31, a tip portion 33, and a flange 39. In the air pipe 31, a flow path 32, which is cylindrical cavities through which air flows, is formed inside the air pipe 31. The air pipe 31 is connected to a pipe of the mounting head 22, and the negative pressure and the positive pressure are supplied from the pressure applying unit 15. The tip portion 33 is formed at a tip of the air pipe 31 and is a portion that contacts the component 60. A circumferential contact surface 34 is formed at the tip of the tip portion 33 and the contact surface 34 contacts the component 60. A slit 37 is provided in a portion of the circumferential contact surface 34. The slit 37 is a groove or a recessed section for communicating an outer circumferential side and an inner circumferential side of the tip portion 33. The tip portion 33 includes an opening portion 29 having an area larger than that of the flow path 32. In addition, a taper portion 35 having a taper surface 36 connecting the slit 37 and the flow path 32 to each other is formed in an inside portion of the tip portion 33. In the tip portion 33 of the suction nozzle 30, the opening portion 29 and the taper portion 35 are formed in a shape that the dome portion 61 of the component 60 having the dome shape can enter. A cylindrical surface 35a forming cylindrical cavities from the opening portion 29 to the flow path 32 side is formed in the tip portion 33, and a taper surface 36 is formed from the cylindrical surface 35a to the flow path 32. The taper portion 35 is formed with a clearance such that the dome portion 61 and the taper surface 36 are not in contact with each other as much as possible when the dome portion 61 enters and such that the dome portion 61 and the cylindrical surface 35a are not in contact with each other as much as possible. In the suction nozzle, particularly in a case where the slit is not formed, or the like, when the dome portion 61 and the taper surface 36 and/or the cylindrical surface 35a are in contact with each other, a case where the suction canceling of the component is not performed is generated.

The slit 37 may be formed such that the ratio of the opening area Y of the slit 37 to the sectional area X of the flow path 32 (Y/X×100(%), also referred to as a slit area ratio) is 40% or more. When the slit area ratio is 40% or more, the suction canceling of the component 60 is more reliably performed. It is more preferable that the slit 37 is formed so that the slit area ratio is 60% or more. In the suction nozzle 30, when the opening area Y of the slit 37 is increased, negative pressure is unlikely to be obtained when performing the suction of the component 60. Therefore, when the efficiency at the time of the suction is considered, the slit area ratio is preferably 120% or less, more preferably 100% or less, and further preferably 80% or less. The sectional area X of the flow path 32 is a sectional area orthogonal to the air flowing direction. In addition, the opening area Y of the slit 37 is an effective area (minimum area through which air flows) through which air flows when the component 60 is sucked. In addition, it is preferable that one slit 37 is formed on the contact surface 34. When multiple slits 37 are formed, in a case where positive pressure is applied at the time of performing the suction canceling of the component 60, the generation of the airflow of the exhaust and intake (also referred to as an ejector effect) is likely to be generated in the gap between the component 60 and the tip portion 33 (see FIG. 7 to be described below). For example, although multiple slits 37 may be formed as long as the ejector effect is unlikely to be generated at the position and with the size thereof, it is more preferable that one slit is formed.

The tip portion 33 is disposed on the air pipe 31 so as to be slidable in the Z-axis direction (up-down direction) along the air pipe 31. On the outer circumference of the air pipe 31, a circular plate shape of flange 39 is disposed. A spring 38 is disposed between the flange 39 and the tip portion 33. The spring 38 presses the tip portion 33 downward. In the suction nozzle 30, a stress relaxing mechanism using a spring force is configured by the air pipe 31, the tip portion 33, and the spring 38, and the impact on the component 60 can be buffered when performing the suction and the placement thereof.

Figure 4:
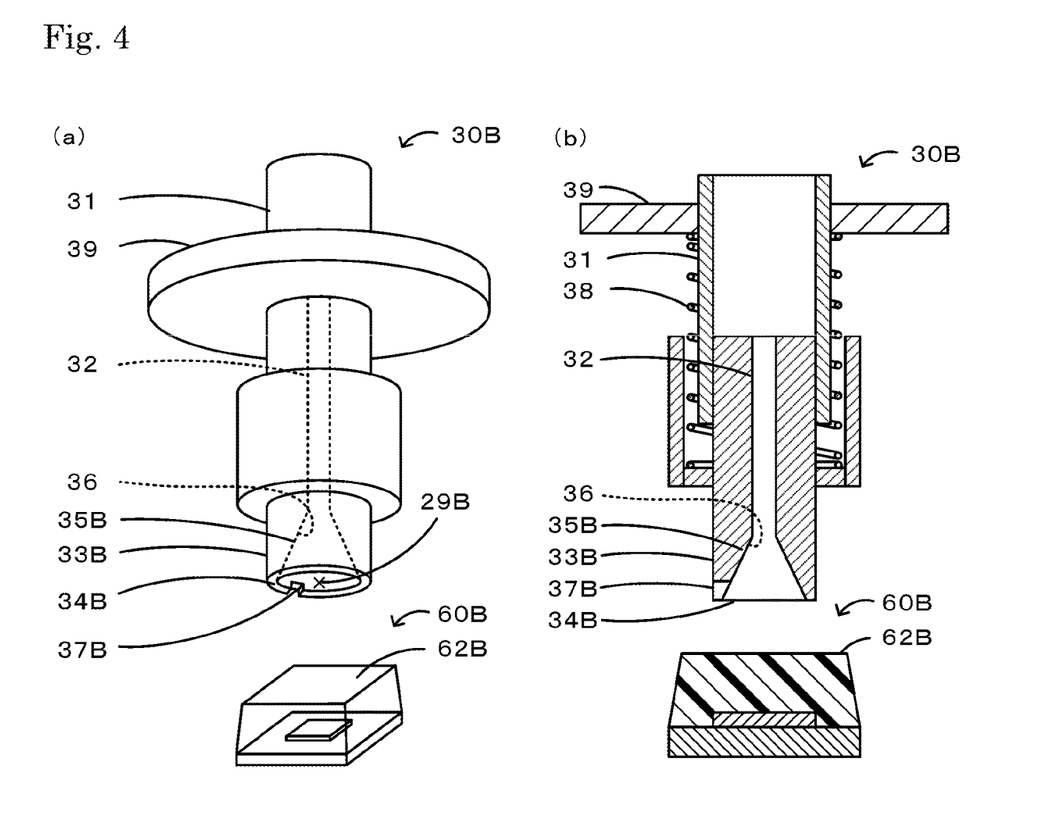
FIG. 4 is an explanatory view of a suction nozzle 30B for sucking a component 60B.

In addition, the mounting head 22 may be configured to mount a suction nozzle 30B. FIG. 4 is an explanatory view of the suction nozzle 30B for sucking a component 60B having a planar (flat) abutting surface 62B, FIG. 4(a) is a perspective view thereof, and FIG. 4(b) is a sectional view thereof. In the suction nozzle 30B, the same reference numerals are given to the same components as those of the suction nozzle 30, and description thereof is omitted. As illustrated in FIG. 4, the suction nozzle 30B is configured to suck and hold the component 60B having the flat upper face. In the component 60B, the abutting surface 62B is formed of a resin having flexibility and/or adhesiveness. The component 60B may be, for example, an LED component in which the abutting surface 62B is formed of a transparent resin having light transmission property. The suction nozzle 30B includes a tip portion 33B. The tip portion 33B is a portion that is formed at a tip of the air pipe 31 and contacts the component 60B. A circumferential contact surface 34B with which the planar abutting surface 62B of the component 60B can be in contact is formed at the tip of the tip portion 33B, and the contact surface 34B contacts the component 60B. A slit 37B is provided in a portion of the circumferential contact surface 34B. The slit 37B is a groove or a recessed section for communicating the outer circumferential side and the inner circumferential side of the tip portion 33B with each other. The tip portion 33B has an opening portion 29B having an area larger than that of the flow path 32. In addition, a taper portion 35B having a taper surface 36 connecting the slit 37B and the flow path 32 to each other is formed in an inside portion of the tip portion 33B. The suction nozzle 30B has a taper portion 35B in which a taper surface 36 is formed from an opening edge of the opening portion 29B to the flow path 32. The slit 37B may have a slit area ratio of 20% or more. In the suction nozzle 30B, when the slit area ratio is 20% or more, the suction canceling of the component 60B can be more reliably performed. The slit 37B is preferably formed so that the slit area ratio is 40% or more, more preferably 60% or more. In the suction nozzle 30B, when the opening area Y of the slit 37B is increased, a negative pressure is unlikely to be obtained when performing the suction of the component 60B. Therefore, when the efficiency at the time of the suction is considered, the slit area ratio is preferably 120% or less, more preferably 100% or less, and further preferably 80% or less. For example, although multiple slits 37B may be formed as long as the ejector effect is unlikely to be generated at the position and with the size thereof, it is more preferable that one slit is formed. A stress relaxing mechanism which is configured by the air pipe 31, the tip portion 33B, and the spring 38 and uses a spring force is provided in the suction nozzle 30B.

The parts camera 16 captures an image of a component sucked by the mounting head 22 and is disposed in front of the board conveyance unit 12. The parts camera 16 transmits the captured image to the control device 40. The captured image is used for determining abnormality of the shape of the component, abnormality of the suction position, or the like.

As illustrated in FIG. 2, the control device 40 is configured as a microprocessor with CPU 41 as a center, and includes a ROM 42 that stores processing programs, an HDD 43 that stores various data, a RAM 44 that is used as a work area, an input and output interface 45 for exchanging electric signal with external devices, and the like, which are connected through a bus 46. The control device 40 outputs control signals to the board conveyance unit 12, the mounting unit 13, the component supply unit 14, the pressure applying unit 15, and the parts camera 16, and inputs signals from the mounting unit 13 or the component supply unit 14, and the parts camera 16. The control device 40 performs a discard process of the component by supplying air to the suction nozzles that sucks the components. In addition, the control device 40 may apply an exhaust pressure of 10 kPa or more to the suction nozzle that sucks the component when performing the discard process.

The management computer 50 is a computer that manages information of each device of the mounting system 10. The management computer 50 includes an input device 52 such as a keyboard and a mouse for inputting various commands by an operator and a display 54 for displaying various kinds of information.

Next, the operation of the mounting system 10 of the present embodiment configured as described above, first, the mounting process of the mounting device 11 will be described. When starting the mounting process, the CPU 41 of the control device 40 controls the mounting unit 13 so that, for example, the suction nozzle 30 corresponding to the component 60 to be collected is mounted on the mounting head 22 and the component 60 is collected from the component supply unit 14. Next, the CPU 41 causes the parts camera 16 to capture an image of the component 60 sucked and held by the mounting head 22. Subsequently, the CPU 41 determines presence or absence of a shape abnormality of the component 60 and presence or absence of a suction position abnormality on the basis of the imaging result of the parts camera 16, places the component 60 on the board S if there is no such abnormality, and the component 60 is discarded to a predetermined discard place if there is any abnormality. The CPU 41 repeatedly performs such process until all the placements of the component 60 on the board S are completed.

Figure 5:
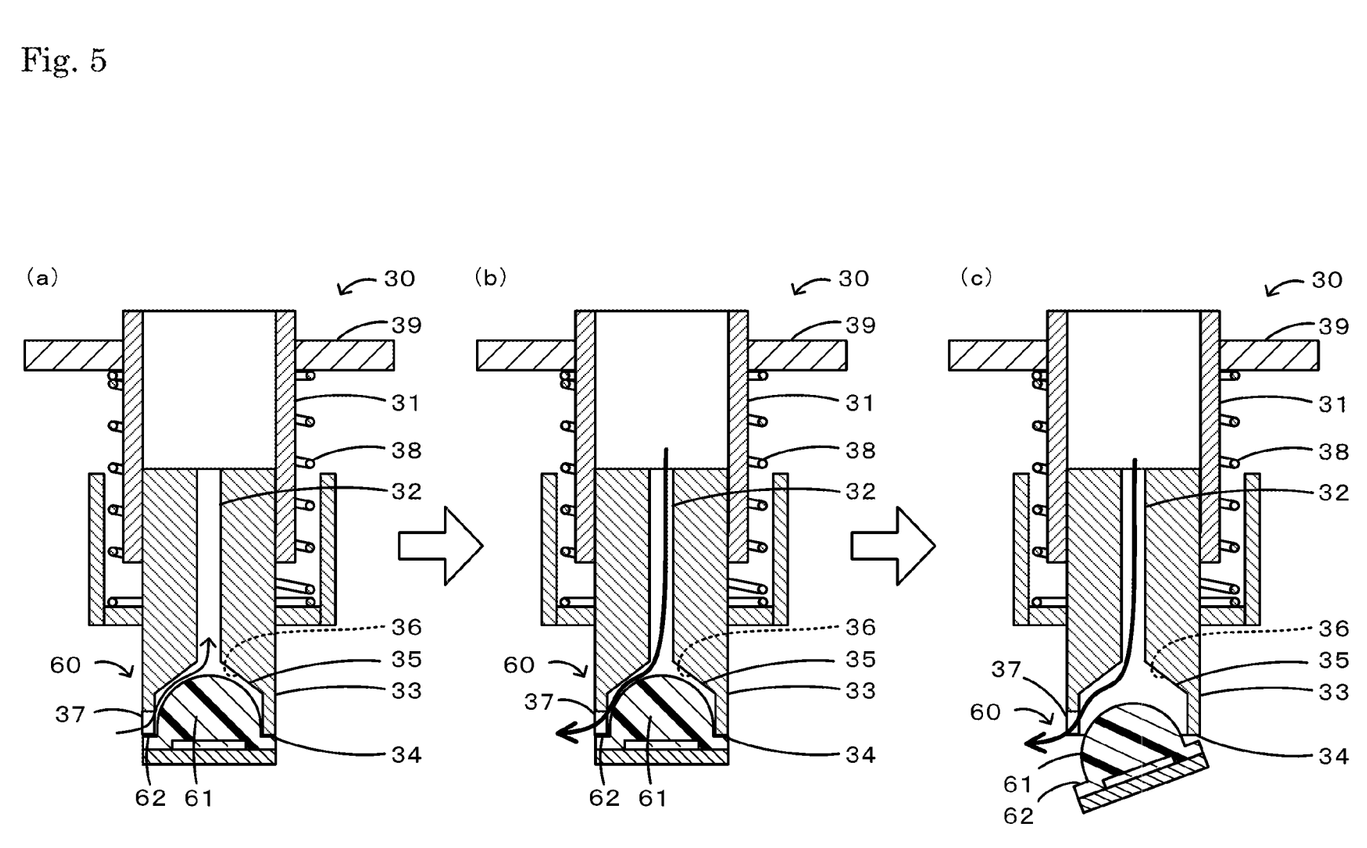
FIG. 5 is an explanatory view when performing the suction canceling of the component 60 from the suction nozzle 30.
Figure 6:
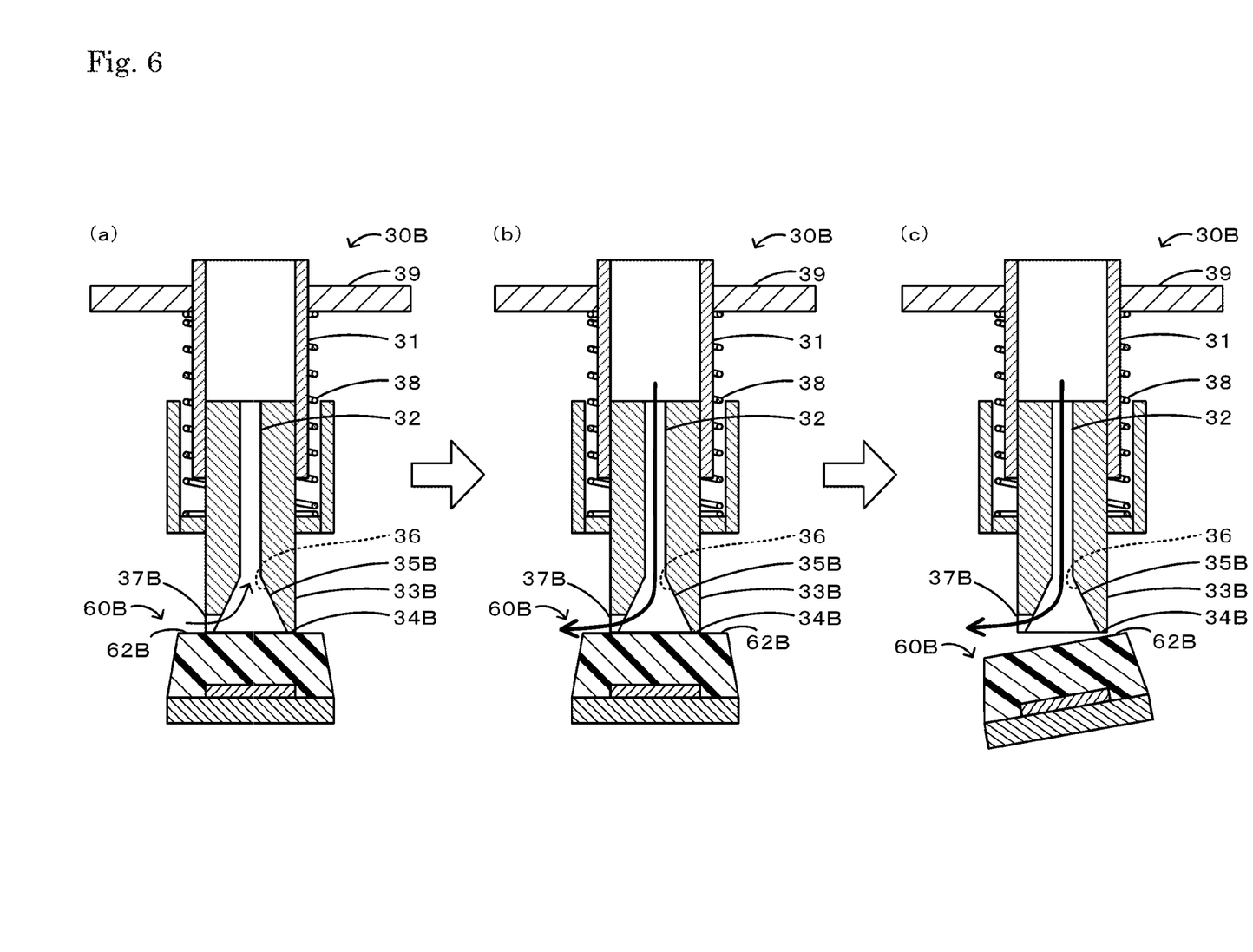
FIG. 6 is an explanatory view when performing the suction canceling of the component 60B from the suction nozzle 30B.
Figure 7:
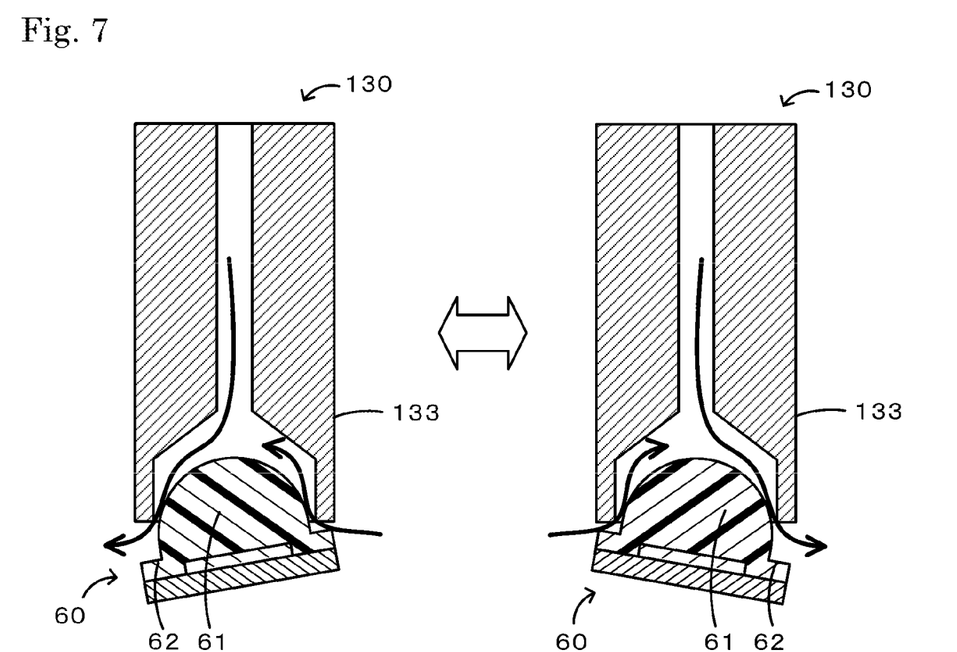
FIG. 7 is an explanatory view when performing the suction canceling of a component 60 from the suction nozzle 130.

Next, a process of discarding component will be described. FIG. 5 is an explanatory view when performing the suction canceling of a component 60 from the suction nozzle 30, FIG. 5(a) is a view when holding the suction, FIG. 5(b) is a view when applying the positive pressure, and FIG. 5(c) is a view when performing the suction canceling. FIG. 6 is an explanatory view when performing the suction canceling of a component 60B from the suction nozzle 30B, FIG. 6(a) is a view when holding the suction, FIG. 6(b) is a view when applying the positive pressure, and FIG. 6(c) is a view when performing the suction canceling. FIG. 7 is an explanatory view when performing the suction canceling of a component 60 from the suction nozzle 130 having no slit. When holding the suction, the control device 40 applies the negative pressure from the pressure applying unit 15 to the suction nozzle 30, whereby air flows from the slit 37 to the flow path 32, and the suction nozzle 30 sucks the component 60 (FIG. 5(a)). When performing the suction canceling, the control device 40 applies the positive pressure from the pressure applying unit 15 to the suction nozzle 30. In the suction nozzle 30, air flows from the slit 37 to the outside portion, and the component 60 is pressed from the slit 37 side (FIG. 5(b)), and the suction is canceled (FIG. 5(c)). The same is also applied to the suction nozzle 30B (FIG. 6). Here, as illustrated in FIG. 7, when the positive pressure is applied to a tip portion 133 in a suction nozzle 130 in which no slit is formed, although air flows between the tip portion 133 and the component 60, on the other hand, an intake state in which air is sucked from a gap also is generated, and the component 60 may be in a state of being not removed from the suction nozzle 130 while revolving. The same is also applied to the component 60B having a flat upper face. The suction nozzles 30 and 30B can further suppress generation of airflow of exhaust and intake (also referred to as ejector effect) generated in a gap between the component and the tip portion described above by the slits 37 and 37B, and the suction state of the component can be more reliably canceled.

Here, the correspondence relationship between the constituent elements of the present embodiment and the constituent elements of the present disclosure will be clarified. The air pipe 31 of the present embodiment corresponds to the air pipe of the present disclosure, the tip portions 33 and 33B correspond to the tip portion, the slits 37 and 37B correspond to the slit, and the taper portions 35 and 35B correspond to the taper portion. In addition, the mounting head 22 corresponds to the mounting head, the control device 40 corresponds to the control section, and the dome portion 61 corresponds to the dome portion. In the present embodiment, an example of the component release method according to the present disclosure is also clarified by the operation of the mounting device 11 being described.

According to the suction nozzle 30 of the embodiment explained above, the tip portion 33 of the air pipe 31 has the opening portion 29 having an area larger than that of the flow path 32 of the air pipe 31, and a slit 37 formed at the tip portion 33 of the air pipe 31 is provided in a portion of the circumferential contact surface 34 contacting the component 60. In the suction nozzle 30, since the air supplied from the air pipe 31 flows out through the slit 37, the suction state of the component 60 is canceled from the position of the slit 37 as a base point and thus the component 60 can be more reliably separated off. In addition, the opening portion 29 of the tip portion 33 is larger than the flow path 32, and the slit 37 is formed on the further outer circumferential side. Therefore, since the air flows out from the further outer circumferential side through the slit 37, stress is likely to be applied to the component 60 and the suction of the component 60 is likely to be canceled. Therefore, in the suction nozzle 30, the suction canceling of the component 60 can be more reliably performed. The same is also applied to the suction nozzle 30B.

In addition, since the tip portion 33 of the suction nozzle 30 is formed in such a shape that the dome portion 61 of the component 60 having the dome shape can enter, when the dome-shaped component 60 is mounted, the suction canceling of the component 60 can be more reliably performed. Furthermore, since the suction nozzle 30 is formed such that the ratio of the opening area Y of the slit 37 to the sectional area X of the flow path 32 is 40% or more, more preferably 60% or more, generation of airflow of exhaust and intake (ejector effect) generated in a gap between a component and a tip portion which can be generated in a case where the positive pressure is applied when performing the suction canceling of a component can be further suppressed. Therefore, in the suction nozzle 30, the canceling of the suction state of the component 60 can be more reliably performed. Since the taper portion 35 having the taper surface 36 connecting the slit 37 and the flow path 32 to each other is formed in the inside portion of the tip portion 33 of the suction nozzle 30, the opening portion 29 having an area larger than that of the flow path 32 can be more easily formed by the taper portion 35. Furthermore, since the taper portion 35 is formed with a clearance such that the dome portion 61 and the taper surface 36 are not in contact with each other when the dome portion 61 enters, the ejector effect can be further suppressed when performing the suction canceling of the component 60, and the canceling of the suction state of the component 60 can be more reliably performed.

In addition, since the contact surface 34B with which the abutting surface 62B of the component 60B having the planar (flat) abutting surface 62B can be in contact is formed in the tip portion 33B of the suction nozzle 30B, the suction of the component having the flat abutting surface can be more reliably performed. Furthermore, since the suction nozzle 30B has the slit area ratio of the slit 37B of 20% or more, the ejector effect can be further suppressed when performing the suction canceling of the component 60B, the canceling of the suction state of the component 60B can be more reliably performed. Furthermore, since the taper portion 35B having the taper surface 36 connecting the slit 37B and the flow path 32 to each other is formed in the inside portion of the tip portion 33B of the suction nozzle 30B, the opening portion 29B having an area larger than that of the flow path 32 can be more easily formed by the taper portion 35B.

In addition, since one slit 37 or 37B is formed in the contact surface 34 or 34B, the suction nozzles 30 and 30B can further suppress the generation of the ejector effect and the canceling of the suction state of the components 60 and 60B can be more reliably performed. Further, since the contact surfaces 34 and 34B can suck and cancel the suction of the components 60 and 60B to the suction and suction canceling are difficult to be performed because the components 60 and 60B are formed of a resin having flexibility and/or adhesiveness, the significance of applying the present disclosure to the suction nozzles 30 and 30B is high.

In addition, since the mounting device 11 includes any one of the suction nozzles 30 and 30B, the suction canceling of the components 60 and 60B can be more reliably performed. Further, since the mounting device 11 includes the suction nozzles 30 and 30B, even in a relatively low pressure range of about 10 kPa, the suction canceling of the component can be more reliably performed.

The present disclosure is not limited to the embodiment described above at all and can be implemented in various modes as long as it falls within the technical scope of the present disclosure.

For example, in the embodiment described above, although the tip portion is described as including a taper portion having a taper surface, the tip portion is not particularly limited thereto, as long as it has an opening portion having an area larger than that of the flow path, and for example, the tip portion may be formed in a stepped shape and do not have a taper surface. In the suction nozzle as well, since the component can be separated off from the suction nozzle from the position of the slit as the base point by the air flowing out from the slit formed on the further outer circumferential side, the suction canceling of the component can be more reliably performed.

In the embodiment described above, although one slit is formed on the contact surface, two or more slits may be formed as long as the slit is configured to suppress the generation of the ejector effect as compared with the contact surface without the slit.

In the embodiment described above, although the abutting surface of the component to be sucked by the suction nozzle is formed of a resin having flexibility and/or adhesiveness, it is not particularly limited thereto and the abutting surface may not have the flexibility and/or adhesiveness.

In the embodiment described above, although the process of discarding the component using the suction nozzle is described, in the sense that the suction of the component by the suction nozzle is canceled, it is not limited to the discard process and it may be as the component is disposed on the board, for example.

In the embodiment described above, although the present disclosure is described as the mounting device 11, it may be a suction nozzle and it may be a component release method that supplies air to the suction nozzle and separate the component off from the suction nozzle from the position of the slit as the base point by the air flowing out of the slit.

EXAMPLE

Hereinafter, an example in which the suction nozzle of the present disclosure is specifically examined will be described as an example. The present disclosure is not limited to the following examples at all and can be implemented in various modes as long as they fall within the technical scope of the present disclosure.

In the present example, suction nozzles having opening areas of various slits were prepared, and after sucking the component using amounting device, it was examined whether or not the suction canceling (discard) of the component could be performed. In suction canceling of the component when performing the mounting process, although the exhaust pressure was decreased so as not to affect the disposed component existing in the vicinity of the component to be performed the suction canceling, in this case, on the premise of the discard of the component, if the suction canceling of the component could be performed, the relatively high exhaust pressure was also examined. A first suction nozzle (FIG. 3) for sucking a dome-shaped component having a dome portion and a second suction nozzle (FIG. 4) for sucking a rectangular parallelepiped component having a flat abutting surface were manufactured. In the first suction nozzle, one slit was formed, the ratio (slit area ratio) of the slit opening area Y to the sectional area X of the flow path and the exhaust pressure of the mounting device were set as illustrated in Table 1. In the second suction nozzle, one slit was formed, and the slit area ratio and the exhaust pressure of the mounting device were set as illustrated in Table 2. The dome-shaped component and the rectangular parallelepiped component are LED components and a transparent resin having flexibility and adhesiveness is formed on the abutting surface. Such components have a characteristic that is unlikely to perform canceling of the suction by suction nozzles.

In the first nozzle, as illustrated in Table 1, it was found that if the slit is formed, a state where the suction of the component could not be canceled could be further improved. However, when the slit area ratio was low, for example, when the slit was blocked due to a deviation of the component or the like, there was a case the ejector effect (refer to FIG. 7) was generated and the suction could not be canceled. Regarding this, in the first nozzle, it was found that in the range of the exhaust pressure of 10 to 105 kPa, the suction canceling is improved when the slit area ratio is 40% or more and the suction could be completely canceled when the slit area ratio is 60% or more. When the device configuration is considered, the suction canceling of the component is desirably performed at a lower exhaust pressure. Similarly, in the second nozzle, as illustrated in Table 2, it was found that if the slit was formed, a state where the suction of the component could not be canceled could be further improved. However, when the slit area ratio is low, there was a case where the ejector effect was generated and thus the suction canceling cannot be performed. Regarding this. In the second nozzle, it was found that in the range of the exhaust pressure of 10 to 53 kPa, the suction could be completely canceled when the slit area ratio was 20% or more.

TABLE 1

Suction canceling (discard) test result of dome-shaped component

| Exhaust pressure kPa | Slit area ratio | | | | |
|---|---|---|---|---|---|
| | 0% | 16% | 26% | 42% | 63% |
| | Number of suction canceling failure/Number of tests | | | | |
| 4 | | | | | 5/5 |
| 10 | | | | | 0/20 |
| 30 | 10/10 | 8/20 | 5/20 | 1/20 | 0/20 |
| 53 | | | | | 0/20 |
| 77 | | | | | 0/20 |
| 105 | | | | | 0/20 |

TABLE 2

Suction canceling (discard) test result of planar component

| Exhaust pressure kPa | Slit area ratio | | | |
|---|---|---|---|---|
| | 0% | 12% | 21% | 30% |
| | Number of suction canceling failure/Number of tests | | | |
| 10 | | | 0/10 | 0/10 |
| 53 | 14/18 | 1/5 | 0/10 | 0/10 |

INDUSTRIAL APPLICABILITY

The present disclosure can be used to a mounting device which disposes components on a board.

REFERENCE SIGNS LIST

10: mounting system, 11: mounting device, 12: board conveyance unit, 13: mounting unit, 14: component supply unit, 15: pressure applying unit, 16: parts camera, 20: head moving section, 22: mounting head, 24: negative pressure supply section, 25: positive pressure supply section, 26: electromagnetic valve, 29, 29B: opening portion, 30, 30B, 130: suction nozzle, 31: air pipe, 32: flow path, 33, 33B, 133 tip portion, 34, 34B: contact surface, 35, 35B: taper portion, 35a: cylindrical surface, 36: taper surface, 37, 37B: slit, 38: spring, 39: flange, 40: control device, 41: CPU, 42: ROM, 43: HDD, 44: RAM, 45: input and output interface, 46: bus, 50: management computer, 52: input device, 54: display, 60, 60B: component, 61: dome portion, 62, 62B: abutting surface, S: board

The invention claimed is:

1. A suction nozzle used in a mounting device for mounting a component on a board, comprising:
   an air pipe;
   a tip portion for contacting a component, the tip portion being formed at a tip of the air pipe, and including an opening portion having an area larger than that of an air flow path formed in the air pipe; and
   only one slit that is provided on a portion of a circumferential contact surface of the tip portion,
   wherein a ratio of an opening area Y of the only one slit to a sectional area X of the air flow path is between 20% and 120%.

2. The suction nozzle according to claim 1,
   wherein the tip portion is formed in a shape that a dome portion of the component having a dome shape can enter.

3. The suction nozzle according to claim 1,
   wherein the ratio of the opening area Y of the only one slit to the sectional area X of the air flow path is greater than or equal to 40%.

4. The suction nozzle according to claim 1,
   wherein the ratio of the opening area Y of the only one slit to the sectional area X of the air flow path is greater than or equal to 60%.

5. The suction nozzle according to claim 1,
   wherein the contact surface formed in the tip portion is capable of contacting an abutting surface of the component of which the abutting surface is planar,
   wherein the contact surface with which the abutting surface of the component having a planar abutting surface can be in contact is formed in the tip portion.

6. The suction nozzle according to claim 1,
wherein a taper portion having a taper surface connecting the only one slit and the flow path to each other in an inside portion thereof is formed in the tip portion.

7. The suction nozzle according to claim 1,
wherein the only one slit is formed on the contact surface.

8. The suction nozzle according to claim 1,
wherein an abutting surface of the tip portion of the suction nozzle to be contacted sucks a component formed of a resin having at least one of flexibility or adhesiveness.

9. A mounting device, comprising:
a mounting head on which the suction nozzle according to claim 1 is mounted; and
a control section that performs a discard process of the component by supplying air to the suction nozzle that sucks the component.

10. The mounting device according to claim 9,
wherein the control section applies an exhaust pressure of 10 kPa or more to the suction nozzle that sucks the component when performing the discard process.

11. A component release method, comprising:
supplying air to the suction nozzle according to claim 1, which sucks the component; and
separating the component off from the suction nozzle from the position of the slit as a base point by air flowing out of the slit.

\* \* \* \* \*